United States Patent [19]

Foster et al.

[11] Patent Number: 4,998,879
[45] Date of Patent: Mar. 12, 1991

[54] HIGH PURITY DIFFUSION FURNACE COMPONENTS

[75] Inventors: Bryan D. Foster, Holden, Mass.; Frank Fonzi, Bay City, Mich.

[73] Assignee: Norton Company, Worcester, Mass.

[21] Appl. No.: 339,570

[22] Filed: Apr. 18, 1989

Related U.S. Application Data

[63] Continuation-in-part of Ser. No. 188,238, Apr. 29, 1988, abandoned.

[51] Int. Cl.$^5$ .............................................. F27D 5/00
[52] U.S. Cl. ..................................... 432/253; 432/239
[58] Field of Search ................... 432/239, 152, 256, 5, 432/6, 11; 427/228

[56] References Cited

U.S. PATENT DOCUMENTS

| | | | |
|---|---|---|---|
| 3,951,587 | 4/1976 | Alliegro et al. | 432/253 |
| 4,713,275 | 12/1987 | Riccitiello et al. | 244/117 A X |
| 4,761,134 | 8/1988 | Foster | 432/253 |
| 4,766,013 | 8/1988 | Warren | 427/228 |

Primary Examiner—Henry A. Bennett
Assistant Examiner—Christopher Kilner
Attorney, Agent, or Firm—Arthur A. Loiselle, Jr.

[57] ABSTRACT

Components for semiconductor diffusion furnaces are constructed of a high purity impervious silicon carbide or silicon nitride matrix deposited on a pre-shaped fibrous matrix of silicon carbide, carbon, or carbon coated silicon carbide. The high purity of the matrix prevents undesired gaseous components from contaminating the atmosphere of the furnace, and the fibrous re-enforcement provides strength combined with light weight.

14 Claims, 1 Drawing Sheet

HIGH PURITY DIFFUSION FURNACE COMPONENTS

BACKGROUND OF THE INVENTION

This application is a continuation-in-part of our co-pending application Ser. No. 07/188,238 filed Apr. 29, 1988, now abandoned.

The invention relates to heating furnaces and components thereof. More particularly, the invention relates to silicon carbide components for a semiconductor diffusion furnace.

In the overall manufacturing process for the production of semi-conductor devices such as diodes and transistors, a critical part of the process involves multiple steps of elevated temperature processing including oxidation, thin film deposits, and doping of thin silicon wafers interspersed with steps of etching of cavities or patterns on the surface of the wafers, to create the formation of transistors and other semiconductor devices. These semiconductor devices are made separately or in an integrated circuit array. The oxidation steps and various doping and coating operations to which the silicon slices are subjected, involve heating and cooling cycles in furnaces at temperatures in the range of from 400° to 1350° C. These critical thermal processing steps generally take place in special electrically heated muffle furnaces. The silicon slices are placed in quartz, silicon carbide, silicon impregnated silicon carbide, or polysilicon boats or jigs or fixtures which are then placed within the process tube of the muffle furnace and the silicon slices are processed through a predetermined time/temperature/atmosphere cycle. The atmosphere is carefully controlled and gases are usually fed into the necked-down end of the diffusion furnace process tube. In these steps of the process the silicon slices in the boats are typically supported on a paddle. These components and process tubes must be made of a material with excellent thermal shock resistance in order to permit rapid heating to, and rapid cooling from, temperatures in the order of 400° to 1350° C. and back to room temperature. The material of which the components and other furnace parts is constructed must also be of high mechanical strength, have the ability to retain its shape through a large number of heating and cooling cycles, and the material must not outgas i.e., introduce any undesirable impurities into the process atmosphere during elevated temperature operations, and the components must not introduce any dust like contamination. Cleanliness and control of impurities are extremely important to the achievement of the ultimate desired electrical characteristics in the semiconductor devices. In addition, the composite components of the invention maintain their physical strength at temperatures well above the normal processing temperatures, unlike quartz.

These demanding conditions severely limit the number of materials which can successfully be used to fabricate diffusion furnace parts or components. Generally the furnace components consist of an external furnace liner which fits in the annular space between the heating element and the process tube, the process tube fitting into the liner and having a necked-down end for the introduction of the desired atmosphere, a paddle—either as a wheeled carrier or as a cantilevered support—upon which are placed wafer supports or boats, as they are known. Occasionally an "internal" liner is used inside the process tube for processes involving progressive build-up of deposits; this inner liner can be tailored for desirable properties and/or can be replaced after excessive build-up without replacing the process tube. An alternative furnace configuration may be that where the outermost tube is the process tube which contains an inner tube which is also a liner. Thus there are external or outer liners and inner liners. Whenever the term liner is used herein, it is meant to include both external and internal liners unless one of the two is indicated. The process tube, paddle, and boat, have been made of fused silica quartz while the liner has been composed of mullite or alumina. However, the silica components lose their mechanical strength and progressively devitrify with time at the processing temperatures involved. In addition, quartz components are very susceptible to extreme distortion from the frequent heating and cooling of the material, and will not withstand frequent cleaning with hydrofluoric acid which is normally required to maintain the necessary ultra pure furnace environment. In a more recent modification of the process, the furnace liner, i.e. the tube which surrounds and supports the process tube, has been constructed of silicon carbide instead of the prior mullite and alumina materials, and used in conjunction with a quartz process tube or inner tube. The silicon carbide possessed high thermal conductivity and high strength as compared to the other materials and provided a barrier to sodium and other metallic ions coming from the heating element and related materials. However, the silicon carbide was porous and permeable and could therefore not provide the controlled atmosphere and high purity environment required for many semiconductor manufacturing processes. Silicon carbide liners, because of their thickness and density, also added a significant thermal mass to the system which caused unacceptably long heat up and cool down times for some processes. A further advancement in diffusion furnaces is disclosed in U.S. Pat. No. 3,951,587. The furnace components are composed of silicon carbide that is at least 99% pure, which is impregnated with silicon which is at least 99.9% pure. Because of the high strength, imperviousness, and purity of this material, it could be used as a process tube without need of a separate liner. This saved space and improved overall purity and dependability, but the problem of thermal mass remained. This material is also used for wafer boats and paddles and other components with very good success in most operations. However, there are some operations where the free silicon is a problem.

It is a principal object of the present invention to provide diffusion furnace components viz. liners and/or process tube, paddle, and boat, which possess superior oxidation resistance, thermal shock resistance, high strength, the ability to retain their shape through a large number of heating and cooling cycles, impermeability to gases, a very low surface area, and significant reduction in wall thickness and thermal mass.

SUMMARY OF THE INVENTION

The present invention provides diffusion furnace components which are strong, impermeable, of very high purity, contain no free silicon, and offer a significant reduction in wall thickness and thermal mass. A major disadvantage of the prior art quartz and silicon impregnated silicon carbide components is the fact that while these materials may be devoid of any continuous porosity and thus physically impermeable, the quartz and silicon do allow ions to chemically diffuse through the walls of the component at a relatively rapid rate. The silicon carbide and silicon nitride matrices of the present invention by contrast, do not have this problem. These advantages are gained by the use of composites of silicon carbide or silicon nitride as a matrix, with an internal fibrous reinforcement of silicon carbide fabric or carbon or graphite fabric, including carbon/carbon composites converted to SiC. The fabric is preferably in the form of a woven cloth, but non-woven fabrics can be employed. Graphite coating on the silicon carbide fiber may be employed to provide slippage in the matrix and thus greater fracture toughness.

The fabric, which is of an open structure to allow infiltration and build up of the matrix by chemical vapor infiltration and deposition, by conventional techniques is first formed into the desired final shape. This can be aided by the use of a temporary binder such as a liquid phenolic heat setting polymer, or by use of a thermoplastic softened by a solvent. Prior to final infiltration and coating the resin is burned out.

After shaping and burnout, the fiber preform is infiltrated and coated in a suitable high temperature reaction chamber. Infiltration and coating by silicon carbide is accomplished by hydrogen reduction of methyltrichlorosilane. Infiltration and coating by silicon nitride ($Si_3N_4$) is accomplished by hydrogen reduction of silicon tetrachloride and ammonia. Each of these chemical vapor deposition processes is carried out in a high temperature reaction chamber. The technique of vapor deposition on a suitable substrate is known in the art. The basic process is a hydrogen reduction of the reactive gas in the temperature range of 1100° to 1400° C. which causes the coating to be deposited on a heated substrate essentially molecule by molecule. This process is well known and is described by D. P. Stinton et al. in "Advanced Ceramics by Chemical Vapor Deposition Techniques", CERAMIC BULLETIN, Vol. 67, No. 2 1988, pp. 350-355, which is incorporated herein by reference.

DETAILED DESCRIPTION OF THE INVENTION

Figure 1:
FIG. 1 is an elevated view of a process tube.

The most critical property or characteristic of diffusion furnace components utilized in the manufacture of semi-conductor devices is chemical purity, or at least lack of outgassing of any undesirable impurities that may be contained in the materials from which the components are made. Purity is, of course, as important to the present invention as it is with the prior art diffusion furnace components. However, with the present invention the problem is somewhat reduced because one need not be overly concerned with the purity of all of the material that goes into the component if; (a) the CVD coating of silicon carbide or silicon nitride is pure, and (b) the CVD coating on the fibrous reinforcement is an effective barrier to any undesirable impurities contained in the fibrous reinforcement. Coating or matrix material with as much as about 1% or less by weight of undesirable impurities may be successfully used for the processing of some semiconductor devices. As a general matter, it is preferred that the level of undesirable impurities in the matrix be of the order of about 0.1% or less and even more preferred, is a level of 0.01% or less.

Not all contaminants in the matrix material are necessarily undesirable; what constitutes undesirability is relative to treatment being applied to, for example, silicon wafers. In most applications the presence in the treating atmosphere of sodium, iron, vanadium, copper, boron and/or calcium can be extremely detrimental to the product as can such elements as nickel, chromium, and magnesium. On the other hand, the presence of substantial amounts of aluminum in the treating atmosphere is relatively harmless in many cases. Thus for diffusion furnace components with universal utility the level of all impurities should be kept as low as possible but exceptions can be made depending on the treatment being applied.

An analysis of the silicon carbide matrix of a commercially available component according to the invention was as follows:

| | |
|---|---|
| Fe | 22 ppm |
| Al | <10 ppm |
| B | <10 ppm |
| Ni | 1 ppm |
| Cu | 6 ppm |
| Na | 12 ppm |
| Cr | 1 ppm |
| Ca | 20 ppm |
| Mg | 6 ppm |

These elements are known to be detrimental, with the exception of aluminum, for the intended end use of these components, hence they were the only elements for which the matrix was analyzed. The total amount of impurities was something less than 0.0088% or about 0.01%. If necessary, a matrix with an even lower level of undesirable impurities can be produced by using even purer starting materials and equipment than were used to produce the matrix that was analyzed.

By contrast, an analysis of the complete composite i.e. matrix and reinforcement, produced the following results:

| | |
|---|---|
| Fe | 72 ppm |
| Al | 146 ppm |
| B | 50 ppm |
| Ni | 3 ppm |
| Cu | 98 ppm |
| V | 6 ppm |
| Na | 36 ppm |
| Ca | 64 ppm |

The total impurities was 475 ppm, about 0.05% of the composite. This is about 5 times higher than the total impurities in the matrix alone. As pointed out above, the impurities in the reinforcement, viz. 0.04%, are entrapped by the impermeable matrix and therefore cause no harm to the process. As with the purity of the matrix per se, the overall purity of the composite should be 99% by weight or less, preferably 99.9% or less and most preferably 99.99%. At the present time an overall composite purity level of better than 99.95% cannot be accomplished due to the unavailability of reinforcing material of that degree of purity. However, as the high temperature fiber techology evolves, higher purity material will most likely become available.

A suitable silicon carbide fabric for use in the invention is plain weave Nicalon (trademark) woven cloth manufactured by Nippon Carbon Company in Japan and distributed by Dow Corning Corporation, Midland, Mich. Typical cloth construction is 14 yarns per lineal inch. Typical yarn weight is 210 grams per meter and the yarns are made up of 500 continuous filaments, the filaments averaging 13 microns in diameter. Other weaves such as "Harness Satin" or braided shapes may also be used.

Figure 7:
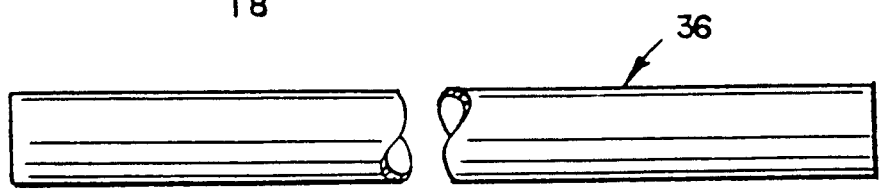
FIG. 7 is an elevated view of a liner which may be an external or internal liner.

To make the liner 36 of FIG. 7 having a wall thickness of about 2 mm, a length of cloth (typically 1 meter wide) is cut to provide the desired length and diameter of the liner to be made. There will be one overlap seam about 20 mm wide running the length of the liner. This piece of cloth is then wrapped on a mandrel of the appropriate diameter and coated and soaked with a suitable temporary organic binder. Often the seam area will require additional support to hold it flat. This can be done with a strand of silicon carbide or other yarn sewn through the overlap, or wound many times around the whole length of the liner.

The temporary binder is then burned out of the liner and silicon carbide is infiltrated and coated by chemical vapor deposition in a heated reaction chamber by hydrogen reduction of methyltrichlorosilane or other conventional technique. Alternatively silicon nitride may be similarly deposited. Sufficient infiltration is accomplished so that the cloth is essentially completely covered and many of the fibers are encapsulated with the applied coating. A typical product would show strong evidence of the woven cloth by the pattern on its surface. Coating thickness would typically range from 25 to 250 microns. Any reasonable thickness may be applied by controlling the gas feed and time of deposition.

Similarly, the process tube 28 of FIG. 1 may be formed. The preferred form of the tube includes a necked down portion 2 terminating in a ball joint 4 or straight stem connection for gas supply. The part can be made by forming the straight and necked down portions from cloth rolled and shaped on a mandrel. Alternatively the part can be formed either by winding of strands or by forming a braided tube on a mandrel. Again the shape is coated and impregnated with a temporary binder which is burned off at about 200° C. in air before the part is put into the CVD reactor.

Figure 2:
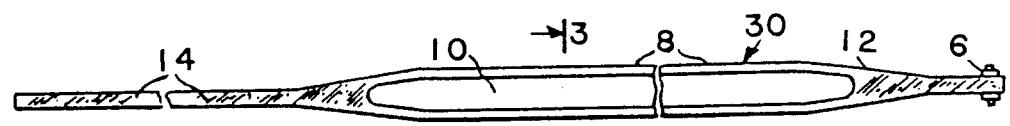
FIG. 2 is a top view of a wheeled paddle.
Figure 3:
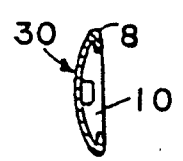
FIG. 3 is a sectional view of FIG. 2 taken through 3—3.
Figure 4:
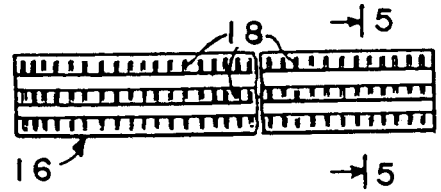
FIG. 4 is a top view of a boat.

Similarly the paddle 30 of FIG. 2, having the cross-section shown in FIG. 3 can be shaped from a single or separately prepared units of fabric, including the end portions 12 and 14 and the depressed portion 10 in which the boats of FIG. 4 are placed. The wheel 6 would be formed separately and attached after the chemical vapor deposition step. Alternatively the paddle may be supported only at its outer end, cantilever fashion, and the wheel 6 eliminated, in order to avoid mechanical wear and contamination in the diffusion furnace.

Figure 5:
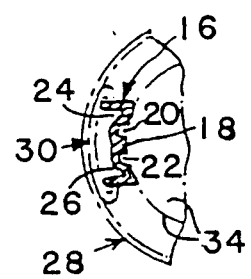
FIG. 5 is a sectional view of the boat of FIG. 4 taken at 5—5.

To make the boat 16 of FIG. 4, having the cross-section shown in FIG. 5, a length of one or two layers of the fabric is dipped in a suitable temporary binder and shaped in a press and with the use of a mandrel to give the desired shape while being heated to set the resin. Prior to the final coating step, the slots 18, for carrying the wafers 34, are cut by an abrasive saw.

Figure 6:
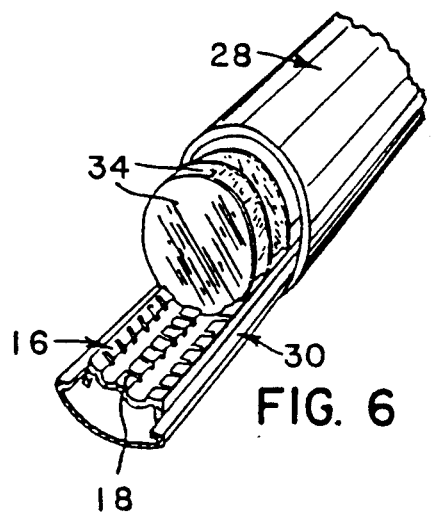
FIG. 6 is a perspective view of the partially assembled furnace including process tube, paddle, and boat with silicon wafers positioned on the latter.

FIG. 6 shows the cooperation between the process tube 28, paddle 30, and boat 16, the latter partially loaded with silicon wafers loaded in slots 18 in boat 16. The paddle 30 can rest on wheel 16 or preferably is cantilevered as described above, with no contact with the process tube 28.

In the event a quartz process tube is used for item 28 FIG. 6, the entire unit of FIG. 6 is preferably contained in liner 36 of FIG. 7, and itself is placed and supported in an electrically heated furnace, to isolate the contents from the furnace atmosphere.

It may be desirable in certain cases to have some of the parts made by the method of the present invention and other parts made by different methods and from different materials.

Although woven cloth is a preferred material to supply the fibrous reinforcement, filament wound or non woven stitch-bonded fabrics may be employed and for complex geometry fibrous batts or similar construction may be employed.

The particular method of CVI and CVD may be varied so long as an impermeable and dense infiltration and coating by the silicon carbide or silicon nitride is achieved, and the total impurity content of the coating is at least less than 1% total of the elements of sodium, iron, boron, nickel, copper, chromium, calcium and magnesium. In the actual commercially available product the level of these undesirable impurities is down to about 0.01% or less by weight. As is well understood in the art, the lower the impurity level, the better.

As mentioned above, one of the more important advantages of the present invention is that the components have a much lower thermal mass than do the diffusion furnace components of the prior art which are thick walled parts made of silicon carbide, silicon carbide impregnated with silicon, or polysilicon. Typically these products of the invention are of the order of 1 to 5 mm or more in wall thickness and preferably 1 to 3 mm if the component is large. It is not unusual for liners or process tubes to measure 9–10 feet (2.7–3 meters) in length with a diameter of 10–12 inches (25.4–30.5 cm).

We claim:

1. A Component for a diffusion furnace, said component being a composite of an impermeable matrix selected from the group consisting of silicon carbide and silicon nitride, and a fabric reinforcement within and coated by said matrix, the reinforcement being silicon carbide, carbon, carbon coated silicon carbide, or combinations thereof, wherein said component is a process tube.

2. A Component for a diffusion furnace, said component being a composite of an impermeable matrix selected from the group consisting of silicon carbide and silicon nitride, and a fabric reinforcement within and coated by said matrix, the reinforcement being silicon carbide, carbon, carbon coated silicon carbide, or combinations thereof, wherein said component is a liner.

3. A Component for a diffusion furnace, said component being a composite of an impermeable matrix selected from the group consisting of silicon carbide and silicon nitride, and a fabric reinforcement within and coated by said matrix, the reinforcement being silicon carbide, carbon, carbon coated silicon carbide, or combinations thereof, wherein said component is a paddle.

4. A Component for a diffusion furnace, said component being a composite of an impermeable matrix selected from the group consisting of silicon carbide and silicon nitride, and a fabric reinforcement within and coated by said matrix, the reinforcement being silicon carbide, carbon, carbon coated silicon carbide, or combinations thereof, wherein said component is a boat.

5. A component for a diffusion furnace according to claim 1, 2, 3, or 4, wherein the wall thickness of said component is at least 1 mm and the impurity level in said matrix is 1% or less by weight.

6. A component for a diffusion furnace according to claim 1, 2, 3, or 4, wherein the wall thickness of said component is at least 1 mm and the impurity level in said matrix is 0.1% or less by weight.

7. A component for a diffusion furnace according to claim 1, 2, 3, or 4, wherein the wall thickness of said component is at least 1 mm and the impurity level in said matrix is 0.01% or less by weight.

8. The component of claim 5 wherein the thickness of said component is from about 1 mm to about 3 mm and the complete composite has a total impurity level of 1% or less by weight made up of the elements sodium, iron, vanadium, copper, nickel, boron, chromium, calcium, and magnesium.

9. The component of claim 8 wherein the complete composite has a total impurity level of about 0.1% or less by weight of the elements sodium, iron, vanadium, copper, nickel, boron, chromium, calcium, and magnesium.

10. The component of claim 8 wherein the complete composite has a total impurity level of about 0.05% or less by weight of the elements sodium, iron, vanadium, copper, nickel, boron, chromium, calcium, and magnesium.

11. A system for a semiconductor diffusion furnace comprising a process tube, a paddle of a size and configuration that will allow said paddle to traverse said process tube, and at least one boat supported on the paddle, wherein said process tube, paddle, and boat, consist essentially of a relatively impermeable matrix selected from the group consisting of silicon carbide and silicon nitride, and a fabric reinforcement within and coated by said matrix which is selected from the group consisting of silicon carbide, carbon, and carbon coated silicon carbide.

12. The system of claim 8 wherein said process tube, paddle and boat have a wall thickness of from about 1 mm to about 3 mm and a total impurity level of 1% or less by weight of the elements sodium, iron, vanadium, copper, nickel, boron, chromium, calcium, and magnesium.

13. The system of claim 12 wherein said process tube, paddle, and boat, have a total impurity level of 0.1% or less by weight of the elements sodium, iron, vanadium, copper, nickel, boron, chromium, calcium, and magnesium.

14. The system of claim 12 wherein said process tube, paddle, and boat, have a total impurity level of 0.05% or less by weight of the elements sodium, iron, vanadium, copper, nickel, boron, chromium, calcium and magnesium.

* * * * *